(12) United States Patent
Sekiguchi et al.

(10) Patent No.: US 9,368,288 B2
(45) Date of Patent: Jun. 14, 2016

(54) PHOTOELECTRIC CONVERSION ELEMENT

(71) Applicant: Panasonic Corporation, Osaka (JP)

(72) Inventors: Takashi Sekiguchi, Osaka (JP);
Masahiro Takahata, Osaka (JP);
Michio Suzuka, Osaka (JP); Naoki Hayashi, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/492,080

(22) Filed: Sep. 22, 2014

(65) Prior Publication Data

US 2015/0101656 A1    Apr. 16, 2015

(30) Foreign Application Priority Data

Oct. 11, 2013  (JP) ................. 2013-213587

(51) Int. Cl.
*H01G 9/20* (2006.01)
*H01L 51/00* (2006.01)

(52) U.S. Cl.
CPC .......... *H01G 9/2059* (2013.01); *H01L 51/0061* (2013.01); *H01L 51/0069* (2013.01); *H01G 9/2031* (2013.01); *Y02E 10/542* (2013.01)

(58) Field of Classification Search
CPC . H01G 9/2059; H01G 9/2063; H01G 9/2009; H01G 9/20; H01G 9/2004; H01G 9/2018
See application file for complete search history.

(56) References Cited

U.S. PATENT DOCUMENTS 4,927,721 A    5/1990  Gratzel et al.
2012/0181516 A1    7/2012  Sekiguchi et al.

FOREIGN PATENT DOCUMENTS

JP    2664194    10/1997
JP    2004-115636    4/2004
JP    2004-200068    7/2004

(Continued)

OTHER PUBLICATIONS

Tu et al., "The synthesis and electrochemical properties of cathodic-anodic composite electrochromic materials", 2010, Dyes and Pigments, 88, pp. 39-43.*

*Primary Examiner* — Jeffrey T Barton
*Assistant Examiner* — Daniel Malley, Jr.
(74) *Attorney, Agent, or Firm* — Renner, Otto, Boiselle & Sklar, LLP

(57) ABSTRACT

A photoelectric conversion element includes a photoanode that includes a solid semiconductor layer containing a dye molecule, a counter electrode, and an electrolyte medium disposed between the photoanode and the counter electrode. The dye molecule includes XD represented by chemical formula (1) and YA represented by chemical formula (2) in a molecule:

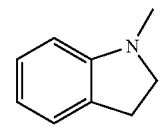

(1)

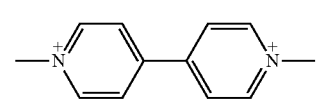

(2)

R(XD/YA), which is a ratio of the number of XD to the number of YA in the dye molecule, is 2 or more.

12 Claims, 4 Drawing Sheets

(56) References Cited

FOREIGN PATENT DOCUMENTS

| JP | 2007066690 A | * | 3/2007 | ........... H01G 9/2031 |
| JP | 2011-006665 | | 1/2011 | |
| JP | WO 2011096508 A1 | * | 8/2011 | ........... H01G 9/2031 |
| JP | 2012-190666 | | 10/2012 | |
| JP | 2013-137876 | | 7/2013 | |
| WO | 2012/121192 | | 9/2012 | |

* cited by examiner

PHOTOELECTRIC CONVERSION ELEMENT

BACKGROUND

1. Field

This disclosure relates to photoelectric conversion elements and, in particular, to a photosensitized photoelectric conversion element. The term, photosensitized photoelectric conversion element, is used also to refer to dye-sensitized solar cells and dye-sensitized power-generating elements capable of generating power in an environment, such as an indoor environment, with a relatively low illuminance.

2. Description of the Related Art

In recent years, dye-sensitized solar cells known as Gratzel cells have attracted much attention as new photoelectric conversion elements (refer to Japanese Patent No. 2664194). A Gratzel cell is constituted by a photoanode, a counter electrode, and an electrolyte medium disposed between the photoanode and the counter electrode. A photoanode typically includes a conductive layer that transmits visible light and a semiconductor layer containing a photosensitizer and formed on the conductive layer. The semiconductor layer contains, for example, porous titanium oxide. A dye serving as a photosensitizer is supported on a surface of porous titanium oxide. The dye is, for example, a ruthenium (Ru) complex. The counter electrode is, for example, a platinum electrode. The electrolyte medium is, for example, an electrolyte solution containing an oxidation-reduction substance (mediator).

Various studies have been conducted on improvements of properties of Grätzel cells. One of the studies involves search for a dye that can improve photoelectric conversion efficiency (hereinafter simply referred to as "conversion efficiency"). Ru complexes, merocyanine (for example, refer to Japanese Unexamined Patent Application Publication No. 2004-115636 (Japanese Patent No. 4080288)), and various other dyes (refer to Japanese Unexamined Patent Application Publication No. 2004-200068 and International Publication No. 2012/121192) have been investigated so far.

However, sufficiently high conversion efficiency has not been achieved with existing dyes. In particular, photoelectric conversion elements that exhibit high conversion efficiency even in an environment, such as an indoor environment, with a relatively low illuminance are highly anticipated.

SUMMARY

This disclosure addresses the issue described above by providing a photoelectrical conversion element having high conversion efficiency.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

A photoelectric conversion element according to an embodiment of this disclosure includes a photoanode that includes a solid semiconductor layer containing a dye molecule, a counter electrode, and an electrolyte medium disposed between the photoanode and the counter electrode. The dye molecule includes XD represented by chemical formula (1) and YA represented by chemical formula (2) in a molecule:

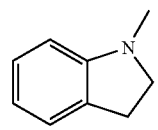

(1)

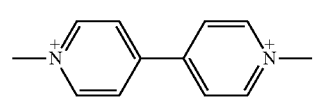

(2)

R(XD/YA), which is a ratio of the number of XD to the number of YA in the dye molecule, is 2 or more.

General or specific embodiments may take a form of an electronic device, a system, a method, or any combination including an electronic device, a system, or a method.

An embodiment of this disclose can provide a photoelectric conversion element having high conversion efficiency.

DESCRIPTION OF EMBODIMENTS

Figure 1A:
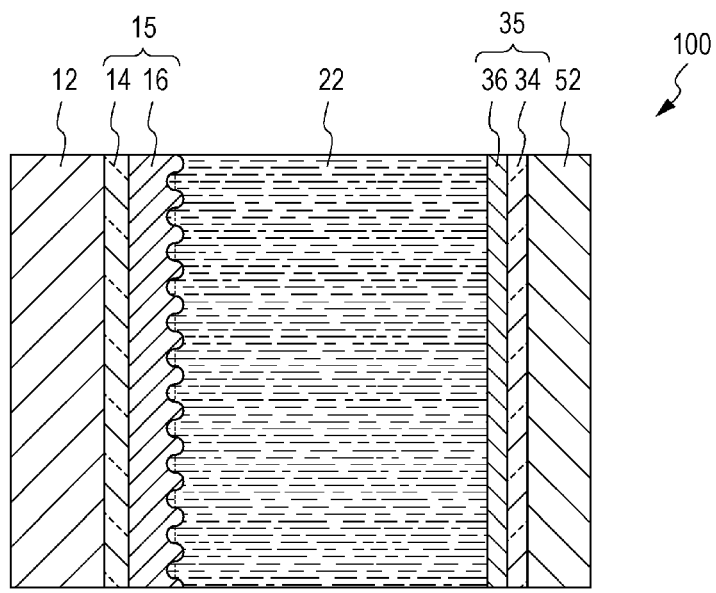
FIG. 1A is a schematic diagram illustrating a structure of a photoelectric conversion element according to an embodiment of the disclosure and FIG. 1B is a schematic diagram illustrating a structure of a semiconductor layer in the photoelectric conversion element.

The disclosure includes photoelectric conversion elements described in the following items.

[Item 1]

A photoelectric conversion element that includes a photoanode that includes a solid semiconductor layer containing a dye molecule, a counter electrode, and an electrolyte medium disposed between the photoanode and the counter electrode. The dye molecule includes XD represented by chemical formula (1) and YA represented by chemical formula (2) in a molecule:

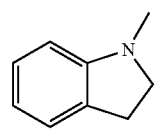

(1)

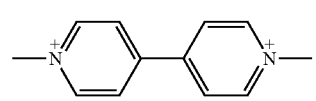

(2)

R(XD/YA), which is a ratio of the number of XD to the number of YA in the dye molecule, is 2 or more.

[Item 2]

The photoelectric conversion element according to Item 1, in which the R(XD/YA) is 4 or less.

[Item 3]

The photoelectric conversion element according to Item 1 or 2, in which the dye molecule includes two XD linked to each other with YA therebetween.

[Item 4]

The photoelectric conversion element according to any one of Items 1 to 3, in which the dye molecule includes only one YA in the molecule.

[Item 5]

The photoelectric conversion element according to any one of Items 1 to 4, in which two or less carbon atoms are present between YA and XD in the dye molecule.

[Item 6]

The photoelectric conversion element according to any one of Items 1 to 5, wherein the dye molecule is represented by general formula (I) below:

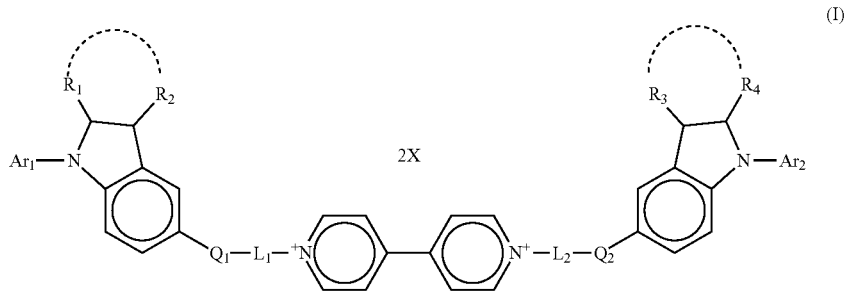

where $Ar_1$ and $Ar_2$ each independently represent an aromatic hydrocarbon residue; $R_1$, $R_2$, $R_3$, and $R_4$ each independently represent a hydrogen atom or an alkyl group or $R_1$ and $R_2$ are linked to each other or $R_3$ and $R_4$ are linked to each other so as to form a cyclopentane ring or cyclohexane ring; $Q_1$ and $Q_2$ each represent a divalent electron-withdrawing organic residue; $L_1$ and $L_2$ each independently represent an alkylene group; and $X^-$ represents a counter anion.

[Item 7]

The photoelectric conversion element according to Item 6, in which $Q_1$ and $Q_2$ each independently represent a divalent electron-withdrawing organic residue represented by one of general formulae (II), (III), (IV), (V), and (VI) below:

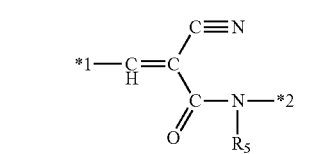

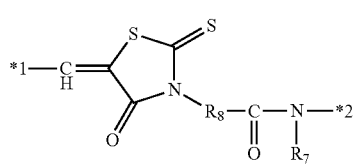

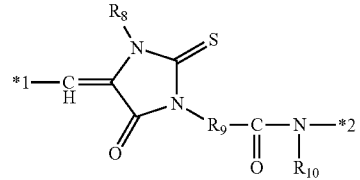

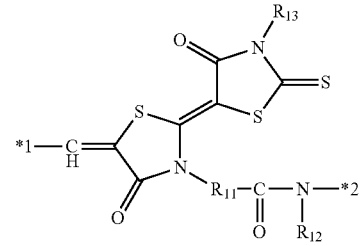

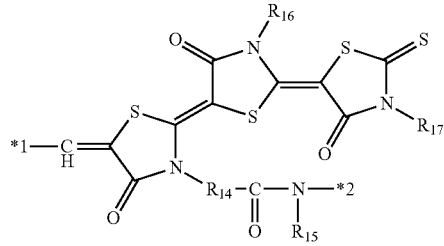

where $R_5$, $R_7$, $R_{10}$, $R_{12}$, and $R_{15}$ each independently represent a hydrogen atom or an alkyl group, $R_6$, $R_9$, $R_{11}$, and $R_{14}$ each independently represent an alkylene group, and $R_8$, $R_{13}$, $R_{16}$, and $R_{17}$ each independently represent an alkyl group, an aralkyl group, or an aryl group.

[Item 8]

The photoelectric conversion element according to Item 7, in which $R_5$, $R_7$, $R_{10}$, $R_{12}$, and $R_{15}$ each independently represent a hydrogen atom or an alkyl group having 1 or more and 4 or less carbon atoms, $R_6$, $R_9$, $R_{11}$, and $R_{14}$ each independently represent an alkylene group having 1 or more and 3 or less carbon atoms, and $R_8$, $R_{13}$, $R_{16}$, and $R_{17}$ each independently represent an alkyl group having 1 or more and 4 or less carbon atoms, an aralkyl group having 7 or more and 14 or less carbon atoms, or an aryl group having 6 or more and 14 or less carbon atoms.

[Item 9]

The photoelectric conversion element according to any one of Items 6 to 8, wherein $L_1$ and $L_2$ each represent an alkylene group having 2 or more and 10 or less carbon atoms.

EMBODIMENTS

Embodiments of the disclosure will now be described with reference to the drawings.

Figure 1B:
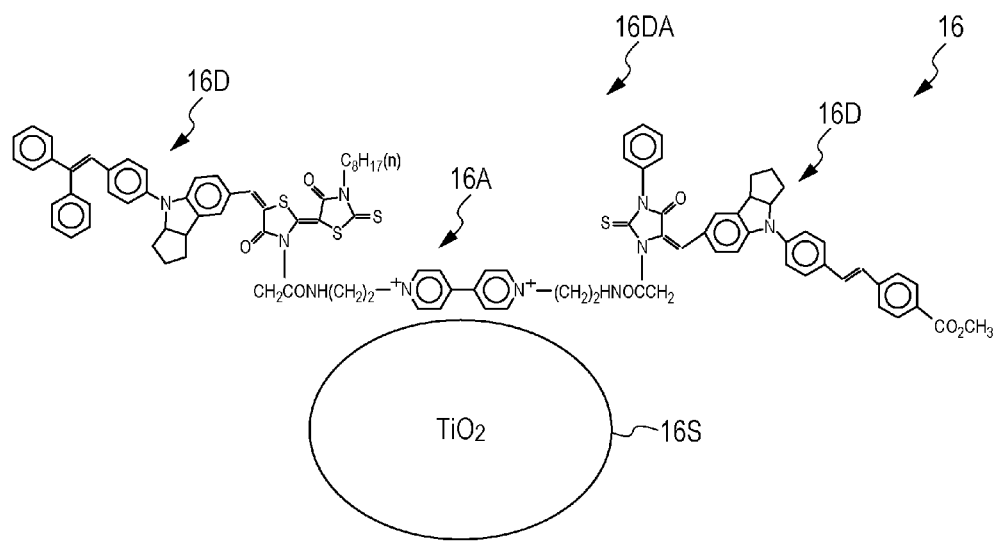

FIG. 1A is a schematic diagram illustrating a structure of a photoelectric conversion element 100 according to an embodiment of the disclosure. FIG. 1B is a schematic diagram illustrating a structure of a solid semiconductor layer 16 in the photoelectric conversion element 100. The solid semiconductor layer 16 contains a novel dye molecule described below.

The photoelectric conversion element 100 includes a photoanode 15, a counter electrode 35, and an electrolyte medium 22 disposed between the photoanode 15 and the counter electrode 35. The electrolyte medium 22 is typically an electrolyte solution and may also be referred to as an "electrolyte solution 22" hereinafter. Instead of an electrolyte solution, an electrolyte gel or a solid polymer electrolyte may also be used, for example.

The photoanode 15 is supported on a substrate 12 and includes, for example, a conductive layer (may also be referred to as a "transparent conductive layer") 14 that transmits visible light and a solid semiconductor layer 16 disposed on the conductive layer 14. The solid semiconductor layer 16 contains a dye molecule that serves as a photosensitizer. The solid semiconductor layer 16 is, for example, a porous semiconductor layer and porous titanium oxide may be used to form the solid semiconductor layer 16. The solid semiconductor layer 16 may be simply referred to as a "semiconductor layer 16".

The counter electrode 35 is arranged to oppose the semiconductor layer 16 with the electrolyte medium 22 therebetween. The counter electrode 35 is supported on a substrate 52 and includes, for example, an oxide conductive layer 34 and a metal layer (for example, a platinum layer) 36 disposed on the oxide conductive layer 34.

The electrolyte medium 22 is, for example, an electrolyte solution containing a mediator and is sealed in a space between the photoanode 15 and the counter electrode 35 with a seal unit not illustrated in the drawings.

As illustrated in FIG. 1B, the semiconductor layer 16 includes, for example, a porous titanium oxide ($TiO_2$) 16S and a dye molecule 16DA supported on the surface of the porous titanium oxide 16S. The dye molecule 16DA is not limited to a dye molecule having a particular chemical structure indicated in FIG. 1B and may be any dye molecule described in Item 1 above.

The dye molecule 16DA contains, in a molecule, a donor part 16D that absorbs visible light and donates excited electrons and an acceptor part 16A that accepts the electrons from the donor part 16D. The donor part 16D includes XD represented by chemical formula (1) below and the acceptor part 16A includes YA represented by chemical formula (2) below:

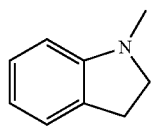

(1)

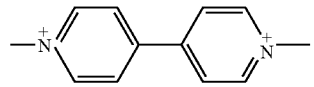

(2)

R(XD/YA), which is the ratio of the number of XD to the number of YA in the dye molecule 16DA, is 2 or more.

The dye molecule 16DA can absorb light highly efficiently, generate electrons, and quickly supply electrons to the titanium oxide 16S because of this structure. Migration of electrons from the titanium oxide 16S to the dye molecule 16DA (reverse reaction) can also be suppressed. Accordingly, a photoelectric conversion element 100 including a semiconductor layer 16 that contains a dye molecule 16DA exhibits higher conversion efficiency than in the related art.

FIG. 1B illustrates the case in which R(XD/YA) is 2. However, R(XD/YA) may be 3 or more. With R(XD/YA) exceeding 4, it may become difficult for the surface of the porous titanium oxide 16S to support the dye molecule 16DA. Thus, R(XD/YA) may be 4 or less.

Figure 2A:
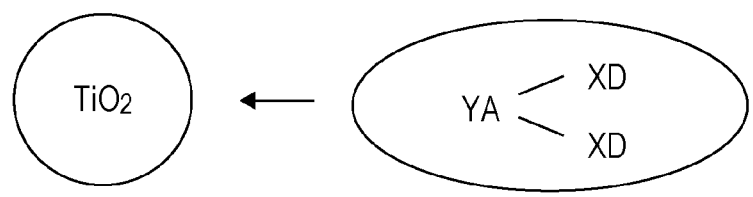
FIGS. 2A and 2B are schematic views used for describing the action of the semiconductor layer containing a dye molecule in the photoelectric conversion element of this disclosure.
Figure 2B:
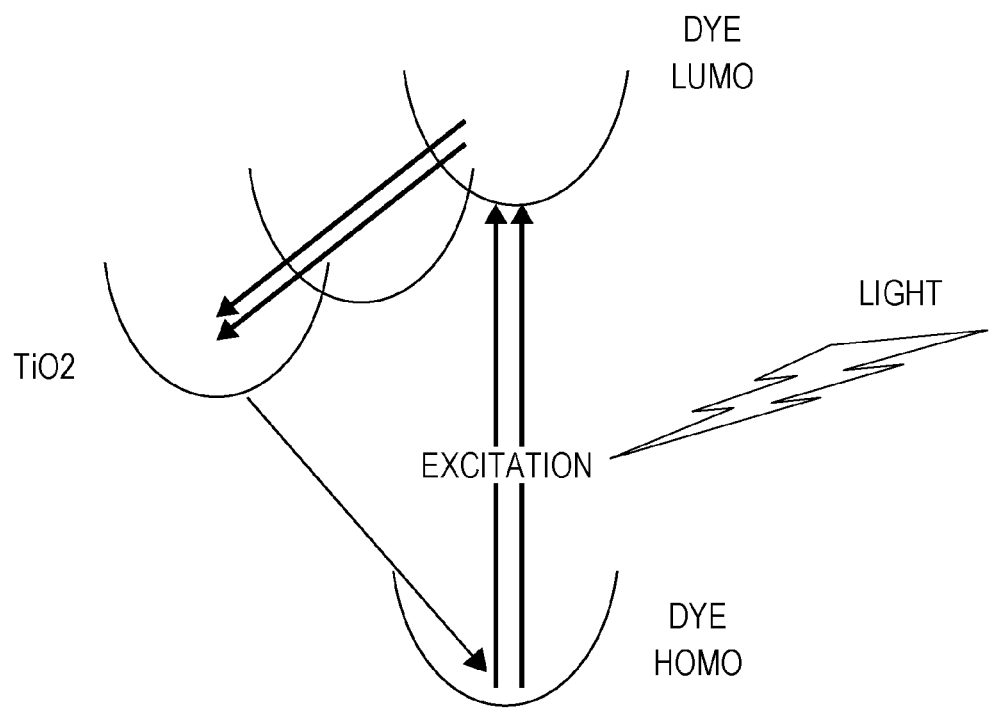

FIGS. 2A and 2B are schematic views used for describing the action of the semiconductor layer 16 containing the dye molecule 16DA in the photoelectric conversion element 100 of this disclosure.

As illustrated in FIG. 2A, the dye molecule 16DA includes two XD and one YA. Two XD are linked with YA therebetween. In other words, there is no other XD present between each XD and YA. As schematically illustrated in FIG. 1B, the acceptor part 16A (containing YA) of the dye molecule 16DA adsorbs onto the surface of the porous titanium oxide 16S.

As illustrated in a schematic energy state diagram of FIG. 2B, the donor part 16D of the dye molecule 16DA absorbs light and is excited. The electrons in the highest occupied molecular orbital (HOMO) are excited, resulting in electronic transition from HOMO to the lowest unoccupied molecular orbital (LUMO). The LUMO electrons migrate in the dye molecule 16DA from the donor part 16D (XD) to the acceptor part 16A (YA). Since two or more XD are present per YA, electrons are efficiently supplied to YA. The electrons supplied to YA are donated to the titanium oxide 16S. At this stage, the acceptor part 16A (YA) suppresses reverse migration of electrons donated to the titanium oxide 16S toward XD and suppresses recombination. Thus, a photoelectric conversion element 100 that includes a semiconductor layer 16 containing a dye molecule 16DA achieves high conversion efficiency. The electrons exited by the donor part 16D (XD) absorbing light migrate in the dye molecule 16DA from the donor part 16D (XD) to the acceptor part 16A (YA), thereby increasing the electron density in the acceptor part 16A (YA). This phenomenon has been confirmed through a simulation based on a molecular orbital method. Gaussian 09 produced by Gaussian Inc. was used in the simulation. Improvements in conversion efficiency of the photoelectric conversion element 100 by the semiconductor layer 16 containing the dye molecule 16DA will be described through Experimental Examples below.

Figure 3A:
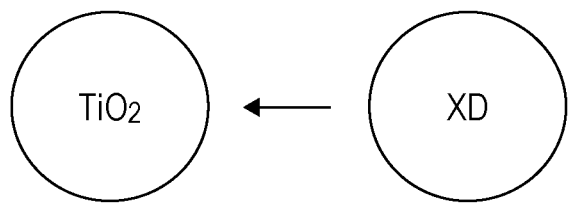
FIGS. 3A and 3B are schematic views used for describing the action of a semiconductor layer containing a dye molecule according to a related art.
Figure 3B:
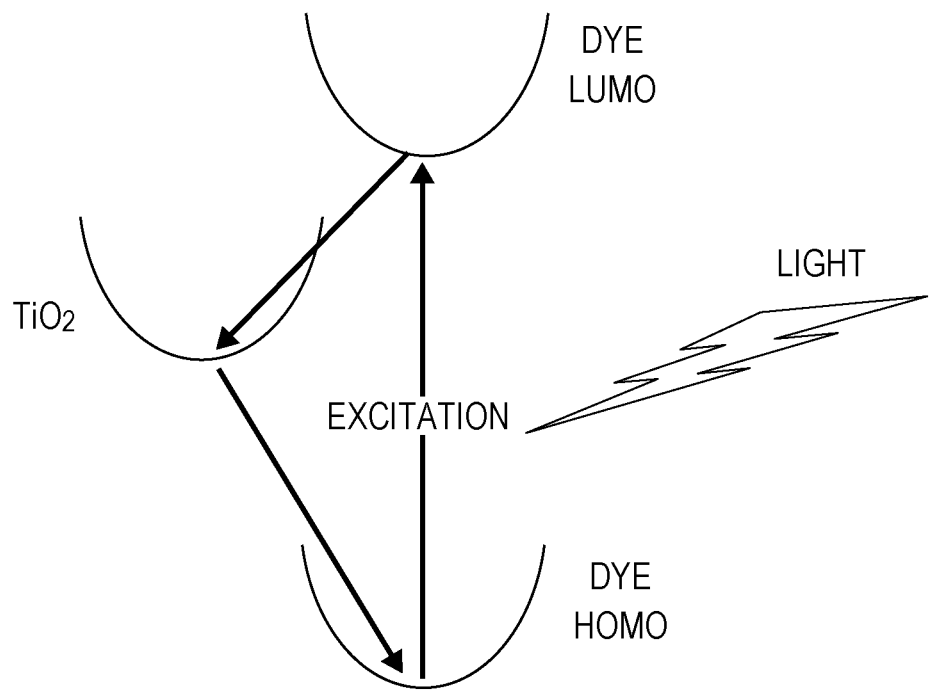

FIGS. 3A and 3B are schematic diagrams used for describing the action of a semiconductor layer containing a dye used in the related art. As illustrated in FIG. 3A, some of the dyes in the related art have a donor part (XD) but not an acceptor part (YA). As illustrated in the schematic energy state diagram of FIG. 3B, electrons excited by absorbing light quickly migrate to titanium oxide when such a dye molecule is used;

however, migration of electrons from titanium oxide to the dye molecule (reverse reaction) also occurs quickly, readily resulting in recombination.

Figure 4A:
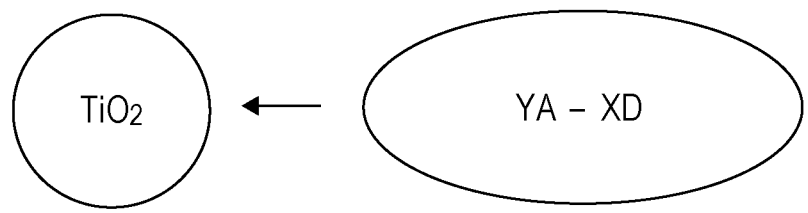
FIGS. 4A and 4B are schematic views used for describing the action of another semiconductor layer containing a dye molecule according to another related art.
Figure 4B:
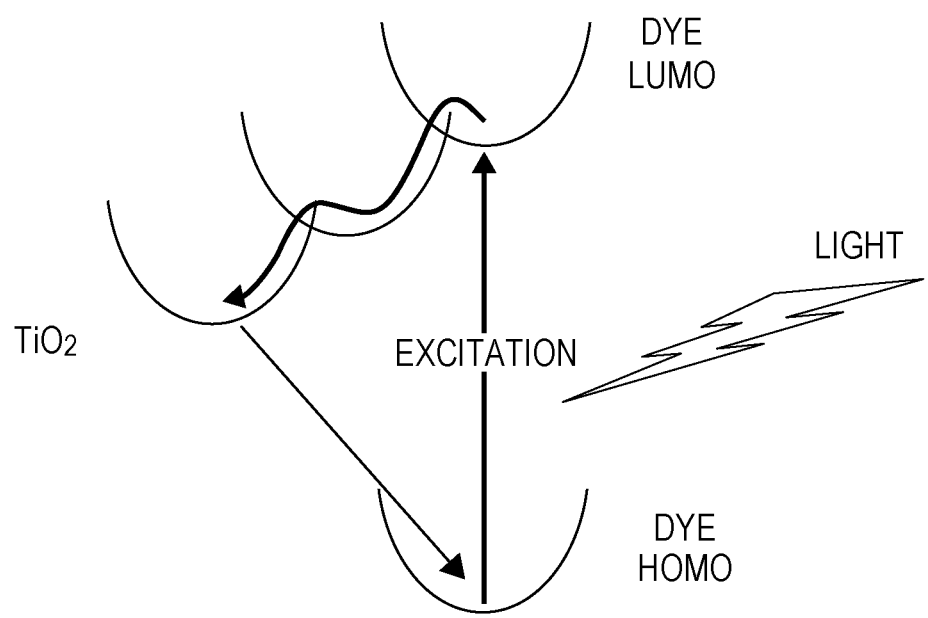

FIGS. 4A and 4B are schematic diagrams used to describe the action of a semiconductor layer that contains a dye molecule containing one donor part (XD) and one acceptor part (YA). As illustrated in FIG. 4B, electrons excited by the donor part (XD) are supplied to the acceptor part (YA) and from the acceptor part (YA) to titanium oxide. Accordingly, when such a dye molecule is used, recombination is prevented as described with reference to FIGS. 2A and 2B and thus the conversion efficiency is higher than that of the structure that uses a dye molecule not including the acceptor part (YA) illustrated in FIGS. 3A and 3B. The dye molecule 16DA used in the photoelectric conversion element 100 according to an embodiment of this disclosure has R(XD/YA), the ratio of the number of XD to the number of YA, of 2 or more as described above. Thus, the conversion efficiency can be improved compared to the structure described with reference to FIGS. 4A and 4B.

International Publication 2012/121192 discloses a dye that contains a light absorption part X and a radical part Y which turns into a radical in one or both of an oxidation state and a reduction state and is capable undergoing repeated oxidation and reduction, in which at least one of X and Y has a functional group that exhibits a chemical interaction with a conductive material. The acceptor part 16A contained in the dye molecule 16DA of this disclosure contains YA (viologen) represented by chemical formula (2) and thus readily adsorbs onto the surface of the porous titanium oxide 16S such as titanium oxide, thereby supplying electrons efficiently. Moreover, XD represented by chemical formula (1) and contained in the donor part 16D of the dye molecule 16DA links with YA and forms a stable dye molecule. Because of the combination of the dye molecule 16DA having XD and YA and the solid semiconductor, it becomes possible to obtain a photoelectric conversion element having higher conversion efficiency than that of the photoelectric conversion element described in International Publication 2012/121192.

The dye molecule 16DA used in the photoelectric conversion element 100 according to an embodiment of this disclosure can be synthesized by a known method by using, as a starting material, a compound represented by chemical formula (3) described in Japanese Unexamined Patent Application Publication No. 2004-2000068:

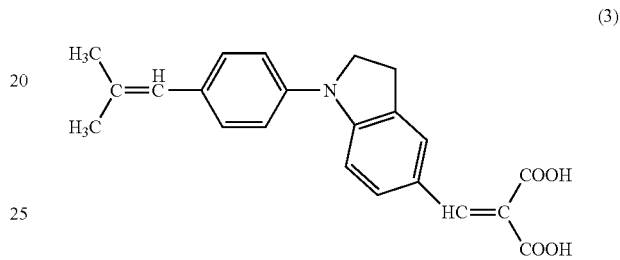

(3)

Specific examples of the compounds that can be used as the dye molecule 16DA are as follows.

Examples in which XD/YA=2/1 are the following compounds represented by chemical formulae (4) to (11):

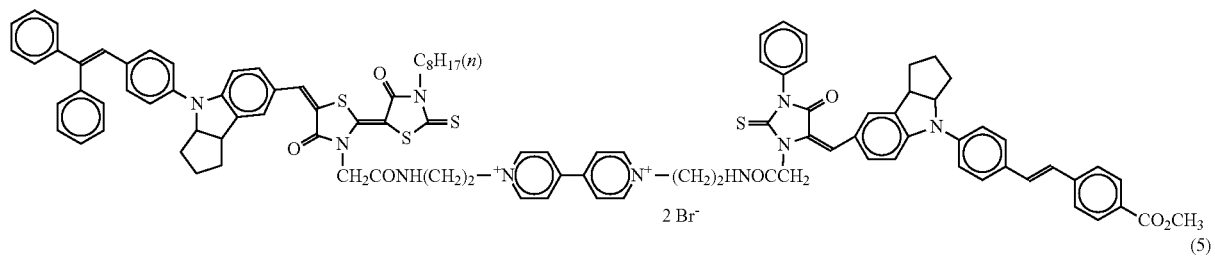

(4)

(5)

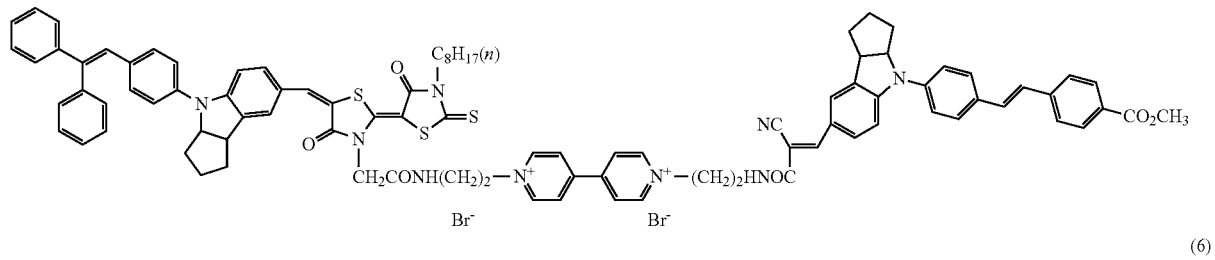

(6)

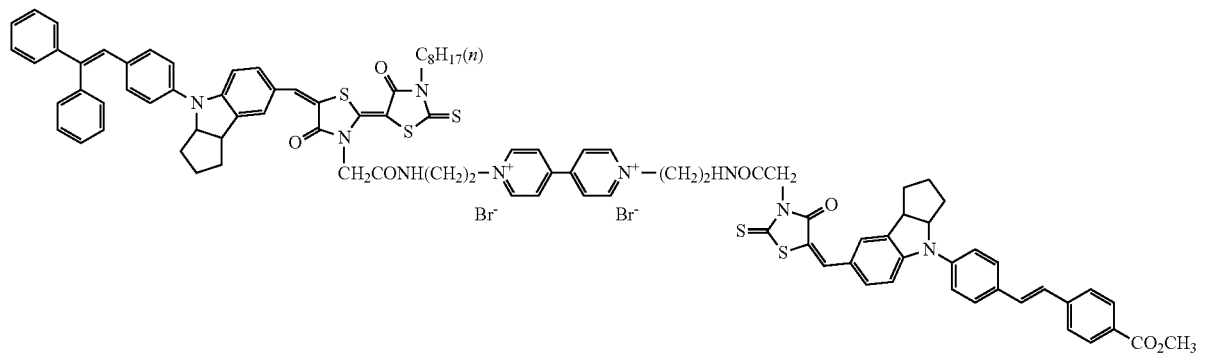

(7)
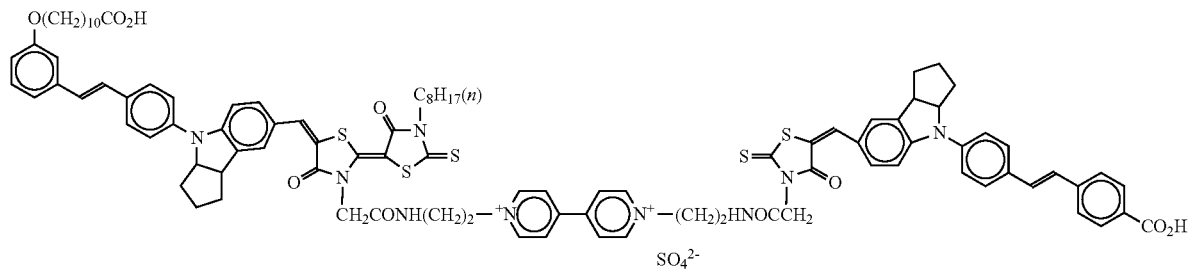
(8)
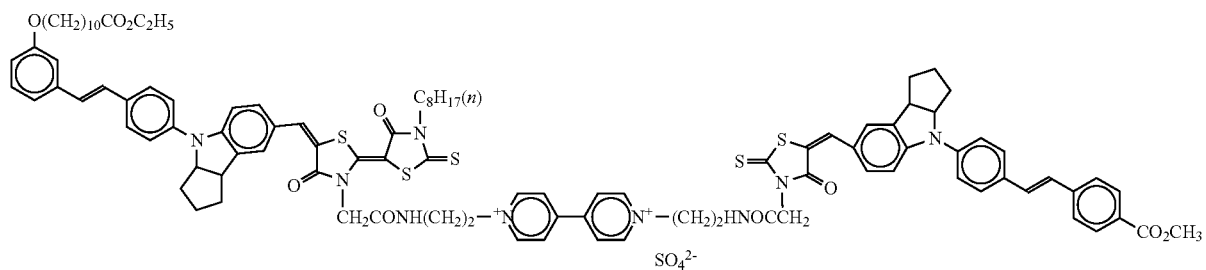
(9)
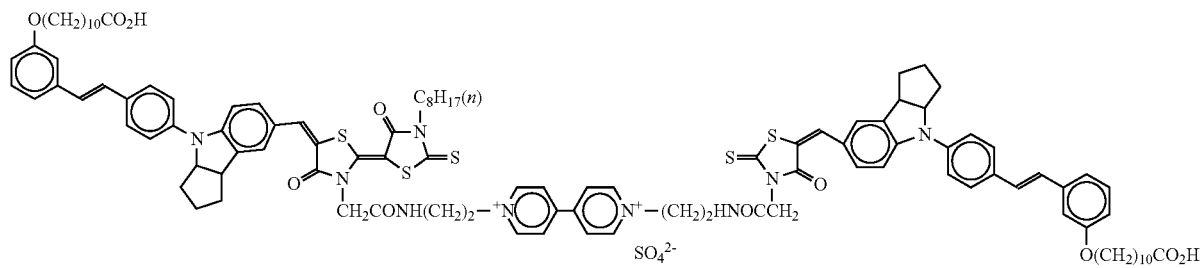
(10)
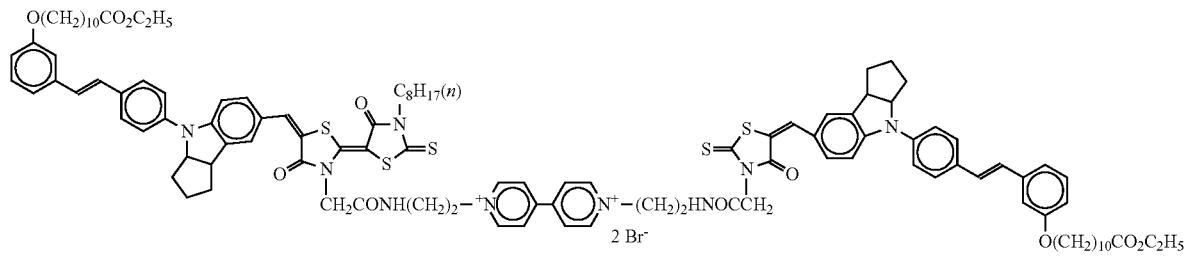
(11)
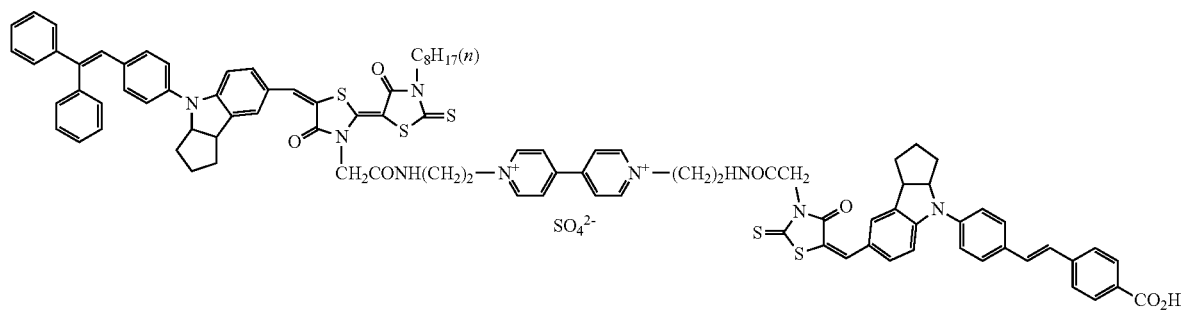
An example in which XD/YA=3/1 is the following compound represented by chemical formula (12):

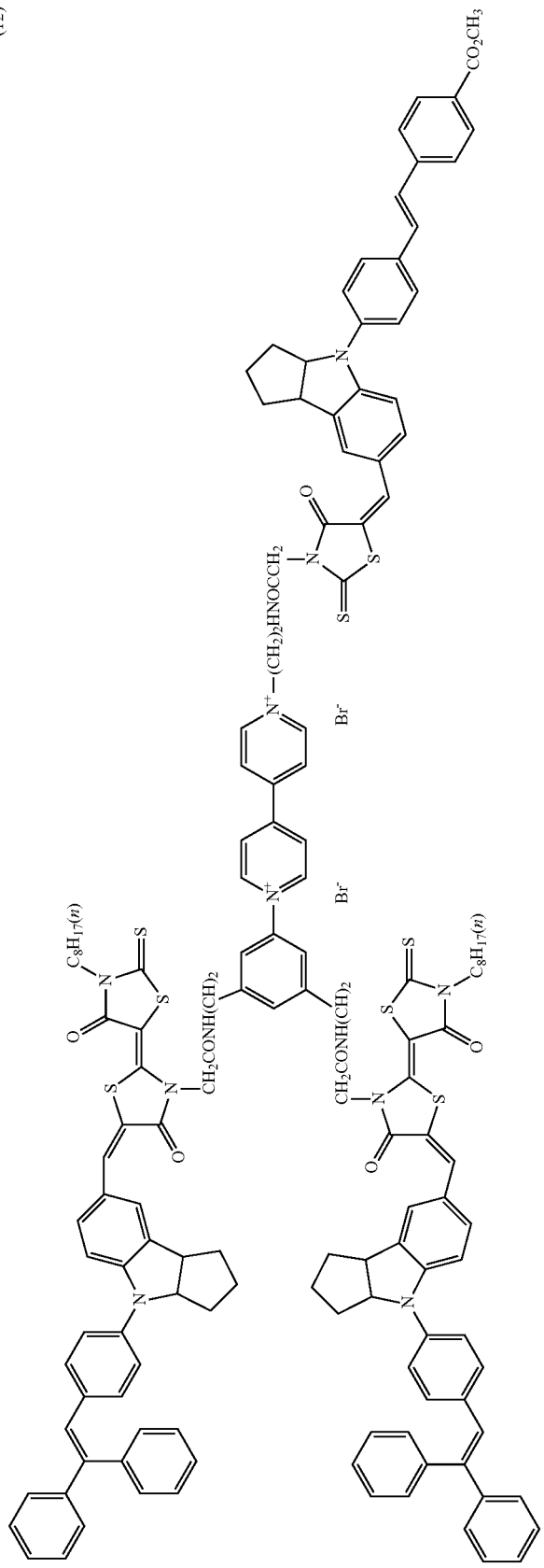

An example in which XD/YA=4/1 is the following compound represented by chemical formula (13):

(13)
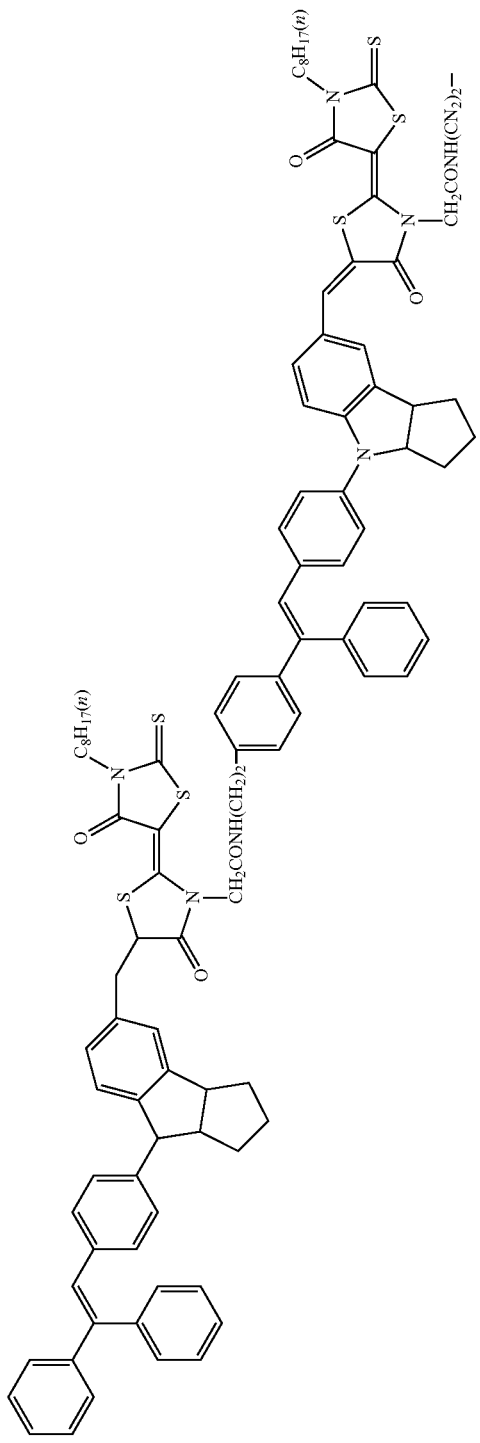
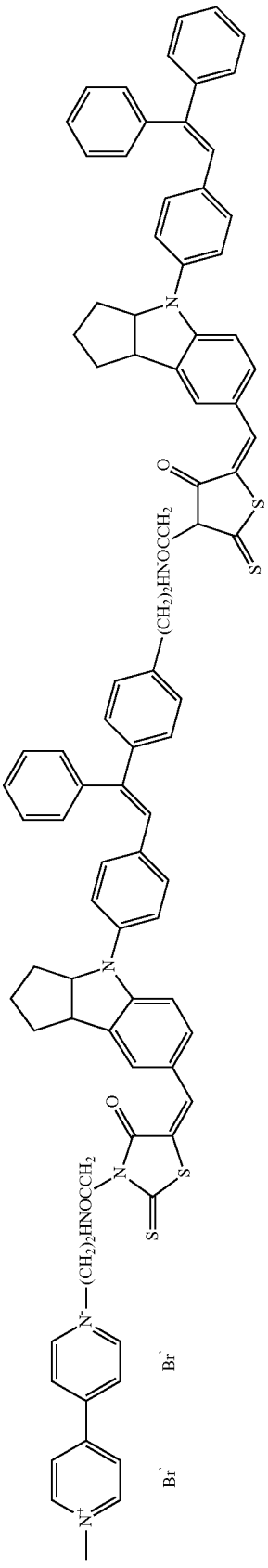
Ⓣ indicates text missing or illegible when filed

Materials used in forming the components of the photoelectric conversion element 100 described above will now be described in detail.

Photoanode

The photoanode 15 serves as a negative electrode of the photoelectric conversion element 100. The photoanode 15 includes, for example, a conductive layer 14 that transmits visible light and a semiconductor layer 16 disposed on the conductive layer 14 as described above. The semiconductor layer 16 contains a dye molecule 16DA. The semiconductor layer 16 containing the dye molecule 16DA may also be referred to as a light absorbing layer. The substrate 12 is, for example, a glass substrate or a plastic substrate (including a plastic film) that transmits visible light.

The conductive layer 14 that transmits visible light can be formed by, for example, using a material that transmits visible light (hereinafter this material is referred to as a "transparent conductive material"). Examples of the transparent conductive material include zinc oxide, indium-tin composite oxide, a multilayer film constituted by an indium-tin composite oxide layer and a silver layer, antimony-doped tin oxide, and fluorine-doped tin oxide. Fluorine-doped tin oxide exhibits particularly high conductivity and translucency. The light transmittance of the conductive layer 14 may be high, 50% or higher, or 80% or higher.

The thickness of the conductive layer 14 is, for example, within the range of 0.1 μm to 10 μm. In this range, a conductive layer 14 having a uniform thickness can be formed and a sufficient amount of light can enter the semiconductor layer 16 since the light transmittance is not degraded. The surface resistance of the conductive layer 14 may be low, 200Ω/□ or lower, or 50Ω/□ or lower. The lower limit is not particularly limited and may be, for example, 0.1Ω/□. Typically, the sheet resistance of a conductive layer of a photoelectric conversion element used under sunlight is about 10Ω/□. However, the photoelectric conversion element 100 used under a fluorescent lamp, for example, having a lower illuminance than sunlight, is less adversely affected by the resistance component in the conductive layer 14 since the photoelectron quantity (photocurrent value) is low. Thus, the surface resistance of the conductive layer 14 in the photoelectric conversion element 100 used in a low-illuminance environment may be within the range of 30 to 200Ω/□ from the viewpoint of reducing cost by reducing the amount of conductive material used in the conductive layer 14.

The conductive layer 14 that transmits visible light can also be formed by using a conductive material that does not have translucency. For example, a metal layer having a stripe pattern, a wavy pattern, a mesh pattern, or a punching metal pattern (numerous fine penetrating holes are arranged regularly or irregularly) or a metal layer having a pattern inverted from the aforementioned pattern of the metal layer can be used. In such a metal layer, light passes through the portions where the metal does not exist. Examples of the metal include platinum, gold, silver, copper, aluminum, rhodium, indium, titanium, iron, nickel, tin, zinc, and alloys containing any of these. A conductive carbon material may also be used instead of the metal.

The transmittance of the conductive layer 14 that transmits visible light may be, for example, 50% or higher or 80% or higher. The wavelength of light to be transmitted depends on the absorption wavelength of the dye molecule.

When light enters the semiconductor layer 16 from the side opposite to the substrate 12, the substrate 12 and the conductive layer 14 need not transmit visible light. Accordingly, when the metal or carbon described above is used to form the conductive layer 14, there is no need to form a region where the metal or carbon does not exist, and if these materials have sufficient strength, the conductive layer 14 may also serve as the substrate 12.

In order to prevent leakage of electrons at the surface of the conductive layer 14, in other words, in order to impart the rectifying property to the portion between the conductive layer 14 and the semiconductor layer 16, an oxide layer may be formed between the conductive layer 14 and the semiconductor layer 16. Examples of the oxide include silicon oxide, tin oxide, titanium oxide, zirconium oxide, and aluminum oxide.

The semiconductor layer 16 containing the dye molecule 16DA includes, as described above, a porous semiconductor 16S and a dye molecule 16DA supported on the surface of the porous semiconductor 16S, for example. The porous titanium oxide 16S is, for example, porous titanium oxide ($TiO_2$). Titanium oxide exhibits a high photoelectric conversion property and does not easily undergo photodissolution in the electrolyte solution. A porous material has a large specific surface area and is advantageous in that a large number of dye molecules can be supported on the porous material. Naturally, the semiconductor layer 16 is not limited to one composed of a porous material and may be formed of aggregated semiconductor particles, for example.

The diameter of the semiconductor particles may be in the range of 5 to 1000 nm or in the range of 10 to 100 nm. When the particle diameter is within the range of 5 to 1000 nm, a semiconductor layer 16 having a surface area at which a sufficient amount of dye molecules can be adsorbed can be formed and the light utilization efficiency can be enhanced. Moreover, since the semiconductor layer 16 has pores of appropriate size, the electrolyte solution (electrolyte medium or charge transport material) can sufficiently penetrate the semiconductor layer 16 and a superior photoelectric conversion property can be obtained.

The thickness of the semiconductor layer 16 may be within the range of 0.1 to 100 μm, 1 to 50 μm, 3 to 20 μm, or 5 to 10 μm. When the thickness of the semiconductor layer 16 is within this range, a sufficient photoelectric conversion effect is obtained and the translucency for the visible light and near-infrared light can be sufficiently obtained. The semiconductor layer 16 of the photoelectric conversion element 100 may have a thickness smaller than the optimum thickness (for example, 10 μm) of a typical semiconductor layer of a photoelectric conversion element of the related art designed to be used under the sun.

The thickness of the semiconductor layer 16 is, for example, 0.01 μm or more and 100 μm or less. The thickness of the semiconductor layer 16 can be appropriately changed by considering the photoelectric conversion efficiency and may be 0.5 μm or more and 50 μm or may be 1 μm or more and 20 μm or less. The surface roughness of the semiconductor layer 16 may be large. The surface roughness coefficient given by effective area/projected area may be 10 or more or 100 or more. The effective area refers to an effective surface area determined based on the volume, which is a product of the projected area and the thickness of the semiconductor layer 16, and the specific surface area and bulk density of the material constituting the semiconductor layer 16.

The semiconductor layer 16 may be composed of, for example, any of the following inorganic semiconductors instead of $TiO_2$: oxides of metal elements such as Cd, Zn, In, Pb, Mo, W, Sb, Bi, Cu, Hg, Ti, Ag, Mn, Fe, V, Sn, Zr, Sr, Ga, Si, and Cr, perovskite materials such as $SrTiO_3$ and $CaTiO_3$, sulfides such as CdS, ZnS, $In_2S_3$, PbS, $Mo_2S$, $WS_2$, $Sb_2S_3$, $Bi_2S_3$, $ZnCdS_2$, and $Cu_2S$, metal chalcogenides such as CdSe, $In_2Se_3$, $WSe_2$, HgS, PbSe, and CdTe, and other materials such as GaAs, Si, Se, $Cd_2P_3$, $Zn_2P_3$, InP, AgBr, $PbI_2$, $HgI_2$, and $BiI_3$. Among these, CdS, ZnS, $In_2S_3$, PbS, $Mo_2S$, $WS_2$, $Sb_2S_3$, $Bi_2S_3$, $ZnCdS_2$, $Cu_2S$, InP, $Cu_2O$, CuO, and CdSe have an advantage that they can absorb light having a wavelength of about 350 nm to 1300 nm. Composites each of which contains at least one material selected from the above-described semiconductors can also be used. Examples of the composites include $CdS/TiO_2$, CdS/AgI, $Ag_2S$/AgI, CdS/ZnO, CdS/HgS, CdS/PbS, ZnO/ZnS, ZnO/ZnSe, CdS/HgS, $CdS_x/CdSe_{1-x}$, $CdS_x/Te_{1-x}$, $CdSe_x/Te_{1-x}$, ZnS/CdSe, ZnSe/CdSe, CdS/ZnS, $TiO_2/Cd_3P_2$, $CdS/CdSeCd_yZn_{1-y}S$, and CdS/HgS/CdS. Organic semiconductors such as polyphenylene vinylene, polythiophene, polyacetylene, tetracene, pentacene, and phthalocyanine can also be used. Viologen polymers, quinone polymers, and the like may also be used.

The semiconductor layer 16 may be formed by any of various known methods. For example, a semiconductor layer 16 composed of an inorganic semiconductor can be formed by applying to a conductive layer 14 a mixture of a semiconductor material powder and an organic binder (including an organic solvent) and heating the applied mixture to remove the organic binder. The method for applying the mixture may be any coating method or printing method known in the art. Examples of the coating method include a doctor blade method, a bar coating method, a spraying method, a dip coating method, and a spin coating method. An example of the printing method is a screen printing method. If needed, a film of the mixture may be pressed.

A semiconductor layer 16 composed of an organic semiconductor can be formed by any of various known methods. For example, a solution of an organic semiconductor may be applied to a conductive layer 14 by a coating or printing method known in the art. When a high-molecular-weight semiconductor having a number-average molecular weight of 1000 or more is used, a coating method such as a spin coating method or a drop casting method or a printing method such as screen printing or gravure printing can be employed. Other than these wet processes, a dry process such as a sputtering method or a vapor deposition method can also be employed.

A dye molecule can be supported on a semiconductor through any of various known processes. An example of the process is a method in which a substrate on which a semiconductor layer (for example, a porous semiconductor not containing a dye molecule) is formed is immersed in a solution prepared by dissolving or dispersing dye molecules. The solvent of this solution may be appropriately selected from among these that can dissolve the dye molecules, such as water, alcohols, toluene, and dimethylformamide. Heat or ultrasonic waves may be applied to the substrate while the substrate is being immersed in the solution of the dye molecules. Moreover, after immersing, excess dye molecules may be removed by washing the substrate with a solvent (e.g., an alcohol) and/or by heating.

The supported amount of the dye molecules in the semiconductor layer 16 is, for example, within the range of $1 \times 10^{-10}$ to $1 \times 10^{-4}$ mol/cm$^2$ and may be, for example, in the range of $0.1 \times 10^{-8}$ to $9.0 \times 10^{-6}$ mol/cm$^2$ from the viewpoints of photoelectric conversion efficiency and cost.

Counter Electrode

The counter electrode 35 functions as a positive electrode of the photoelectric conversion element 100. Examples of the material for forming the counter electrode 35 include metals such as platinum, gold, silver, copper, aluminum, rhodium, and indium, carbon materials such as graphite, carbon nanotubes, and carbon-supported platinum, conductive metal oxides such as an indium-tin composite oxide, antimony-doped tin oxide, and fluorine-doped tin oxide, and conductive polymers such as polyethylene dioxythiophene, polypyrrole, and polyaniline. Among these, platinum, graphite, polyethylene dioxythiophene, or the like may be used.

As illustrated in FIG. 1A, the counter electrode 35 may include a transparent conductive layer 34 on the substrate-52-side. The transparent conductive layer 34 can be formed of the same material as the conductive layer 14 of the photoanode 15. In such a case, the counter electrode 35 may also be transparent. Light can be received from the substrate 52 side or the substrate 12 side when the counter electrode 35 is transparent. This structure is effective when illumination from both sides of the photoelectric conversion element 100 is expected due to the influence of the reflection light and the like.

Electrolyte Medium

Examples of the electrolyte medium 22 include, in addition to an electrolyte solution prepared by dissolving an oxidation-reduction substance (mediator) in a solvent, gel electrolytes, polymer electrolytes, solid electrolytes such as molten salts, p-type semiconductors such as copper iodide, amine derivatives such as triphenylamine, and conductive polymers such as polyacetylene, polyaniline, and polythiophene.

An oxidation-reduction substance refers to a pair of substances that are present by taking form of an oxide and a reductant reversibly in an oxidation-reduction reaction. Examples of the oxidation-reduction substance include chlorinated compound/chlorine, iodized compound/iodine, brominated compound/bromine, thallium(III) ion/thallium(I) ion, mercury(II) ion/mercury(I) ion, ruthenium(III) ion/ruthenium(II) ion, copper(II) ion/copper(I) ion, iron(III) ion/iron(II) ion, nickel(II) ion/nickel(III) ion, vanadium(III) ion-vanadium(II) ion, and manganate ion/permanganate ion. In particular, the oxidation-reduction substance may be iodide/iodine ($I_2$). Examples of the iodide include tetraalkylammonium iodides such as tetrapropylammonium iodide, asymmetric alkyl ammonium iodides such as methyltripropylammonium iodide and diethyl dibutyl ammonium iodide, iodized quaternary ammonium salt compounds such as pyridinium iodide, lithium iodide, and 1,2-dimethyl-3-propylimidazolium iodide.

A stable radical compound can also be used as the oxidation-reduction substance. When a stable radical compound is contained in the electrolyte medium 22, holes generated can be efficiently transported to the counter electrode through a rapid electron transfer reaction of the stable radical compound. Thus, the conversion efficiency can be improved.

The stable radical compound may be any compound having a chemical species with an unpaired electron, namely, a compound having a radical. In particular, a radical compound having a nitroxide (NO.) in a molecule may be used. The radical compound may have a molecular weight (number-average molecular weight) of 1000 or more. At a molecular weight of 1000 or more, the compound is solid or close to solid at room temperature and is less volatile. Thus, the stability of the element is improved.

The electrolyte medium 22 is typically an electrolyte solution 22. The electrolyte solution 22 contains an oxidation-reduction substance, a supporting electrolyte (supporting salt), and a solvent.

Examples of the supporting electrolyte include ammonium salts such as hyperchloric acid tetrabutylammonium, tetraethylammonium hexafluorophosphate, imidazolium salts, and pyridinium salts, and alkali metal salts such as lithium perchlorate and potassium boron tetrafluoride.

The solvent may have high ion conductivity. The solvent may be a water-based solvent or an organic solvent. An organic solvent may be used to stabilize the solute. Examples of the organic solvent include carbonate compounds such as dimethyl carbonate, diethyl carbonate, methyl ethyl carbonate, ethylene carbonate, and propylene carbonate, ester compounds such as methyl acetate, methyl propionate, and γ-butyrolactone, ether compounds such as diethyl ether, 1,2-dimethoxyethane, 1,3-dioxosilane, tetrahydrofuran, and 2-methyl-tetrahydrofuran, heterocyclic compounds such as 3-methyl-2-oxazolidinone and 2-methylpyrrolidone, nitrile compounds such as acetonitrile, methoxyacetonitrile, and propionitrile, and aprotic polar compounds such as sulfolane, dimethylsulfoxide, and dimethylformamide. These may be used alone or in combination as a mixture. Among these, carbonate compounds such as ethylene carbonate and propylene carbonate, heterocyclic compounds such as γ-butyrolactone, 3-methyl-2-oxazolidinone, and 2-methylpyrrolidone, and nitrile compounds such as acetonitrile, methoxyacetonitrile, propionitrile, 3-methoxypropyionitrile, and valeronitrile may be used.

An ionic liquid is used as the solvent. The ionic liquid may be mixed with any of the solvents described above. An ionic liquid has a low volatility and high flame retardancy. All types of ionic liquids known in the art can be used. Examples thereof include imidazolium-based ionic liquids such as 1-ethyl-3-methylimidazolium tetracyanoborate, pyridine-based ionic liquids, alicyclic amine-based ionic liquids, aliphatic amine-based ionic liquids, azoniumamine-based ionic liquids, and ionic liquids described in the specification of European Patent No. 718288, International Publication No. 95/18456, Electrochemistry [Denki-Kagaku] Vol. 65, No. 11, p. 923 (1997), J. Electrochem. Soc., Vol. 143, No. 10, p. 3099 (1996), and Inorg. Chem. Vol. 35, p. 1168 (1996).

The substrate 12 and the substrate 52 are each a glass substrate or a plastic substrate (may be a plastic film) that transmits visible light. In the case where the substrate 12 is transparent, the substrate 52 need not be transparent. Both the substrate 12 and the substrate 52 may be transparent since light can enter from both sides through the substrate 12 and the substrate 52.

The substrate 12 and the substrate 52 are bonded to each other with a seal unit not illustrated in the drawing and the electrolyte medium 22 and the associated components are confined in the space between the substrate 12 and the substrate 52. The seal unit is formed of a thermoplastic resin, for example. Examples of the thermoplastic resin include an ethylene-vinyl acetate copolymer, an ethylene.α-olefin copolymer, an ethylene-methyl acrylate copolymer, an ethylene-ethyl acrylate copolymer, an ethylene-acrylate copolymer, an ethylene-methacrylate copolymer, a linear low-density polyethylene, acrylic resins, silicone-based resins, ionomer resins, polystyrene-based elastomers, polyolefin-based elastomers, polydiene-based elastomers, polyester-based elastomers, polyurethane-based elastomers, fluorine resin-based elastomers, and polyamide-based elastomers. An appropriate material may be selected from these elastomers and resins depending on the material of the surfaces to which the seal unit attaches. The thickness of the seal unit is not particularly limited and may be within the range of 10 μm to 100 μm, for example. The seal unit may be formed of a thermosetting resin or the like.

The photoelectric conversion element 100 can be manufactured by the following method, for example.

A conductive layer 14 and a semiconductor layer 16 are sequentially formed on a substrate 12. Dye molecules are supported on the semiconductor layer 16. A counter electrode 35 is formed on a substrate 52.

While having the semiconductor layer 16 and the counter electrode 35 face each other with a space therebetween, a seal unit is formed so as to surround the semiconductor layer 16 and the space between the semiconductor layer 16 and the counter electrode 35. At this stage, an injection port communicating with the space between the semiconductor layer 16 and the counter electrode 35 is formed in the seal unit.

After injecting the material constituting the electrolyte medium 22 into the space from the injection port, the injection port is closed with a UV curable resin or the like. As a result, a photoelectric conversion element 100 is obtained.

EXAMPLES

Examples of photoelectric conversion elements according to the embodiments of this disclosure will now be described.

Example 1

A photoelectric conversion element having substantially the same structure as the photoelectric conversion element 100 illustrated in FIG. 1A was prepared. The components of the photoelectric conversion element were as follows.

Substrate 12: glass substrate 1 mm in thickness
Transparent conductive layer 14: fluorine-doped $SnO_2$ layer (surface resistance: 10Ω/□)
Semiconductor layer 16: porous titanium oxide and dye molecules
Electrolyte solution 22: acetonitrile solution containing 1 M of 2,2,6,6-tetramethylpyperidine-1-oxyl, 0.5 M of lithium bistrifluoromethane sulfonylimide (LiTFSI), and 1.6 M of N-methylbenzimidazole (1 M=1 mol/L)
Substrate 52: glass substrate 1 mm in thickness
Oxide conductive layer 34: fluorine-doped $SnO_2$ layer (surface resistance: $10\Omega/\square$)
Counter electrode 35: platinum layer A photoelectric conversion element of Example 1 was prepared as follows.

Two conductive glass substrates (produced by Asahi Glass Co., Ltd., surface resistance: $10\Omega/\square$) each having a fluorine-doped $SnO_2$ layer and a thickness of 1 mm were prepared and respectively used as a substrate 12 having a transparent conductive layer 14 and a substrate 52 having an oxide conductive layer 34.

High-purity titanium oxide particles having a mean primary particle diameter of 20 nm were dispersed in ethylcellulose to prepare a paste (first paste) for screen printing. High-purity titanium oxide particles having a mean primary particle diameter of 20 nm and high-purity titanium oxide particles having a mean primary particle diameter of 400 nm were dispersed in ethylcellulose to prepare a paste (second paste) for screen printing.

The first paste was applied to the fluorine-doped $SnO_2$ layer of one of the conductive glass substrates, dried, and baked at 500° C. for 30 minutes in air. As a result, a porous oxide titanium layer having a thickness of 10 µm was obtained.

The second paste was applied to the porous titanium oxide layer, dried, and baked at 500° C. for 30 minutes in air so as to form a porous titanium oxide layer having a thickness of 4 µm. As a result, a porous titanium oxide layer having a thickness of 14 µm was obtained.

The substrate with the porous titanium oxide layer formed thereon was immersed in a 0.3 mmol/dm³ solution of D1VD1 represented by chemical formula (14) below serving as a dye molecule and left immersed in dark at room temperature for 24 hours:

Through this process, a dye adsorption treatment was performed and a porous titanium oxide layer 16 supporting the dye molecule D1VD1 was obtained. As a result, a photoanode 15 was formed.

Platinum was deposited on a surface of the other conductive glass substrate through pyrolysis of chloroplatinic acid to form a metal layer 36. As a result, a counter electrode 35 was formed.

The substrate 12 on which the photoanode 15 was formed and the substrate 52 on which the counter electrode 35 was formed were bonded to each other with a sealing material. The sealing material was applied so as to surround the periphery of the semiconductor layer 16 while leaving a portion where an inlet port was to be formed. After the electrolyte solution described above was injected through the injection port, the injection port was closed with a UV curable resin. As a result, a photoelectric conversion element of Example 1 was obtained.

Example 2

A photoelectric conversion element of Example 2 was obtained as in Example 1 except that D1VD2 represented by chemical formula (15) below was used as the dye molecule:

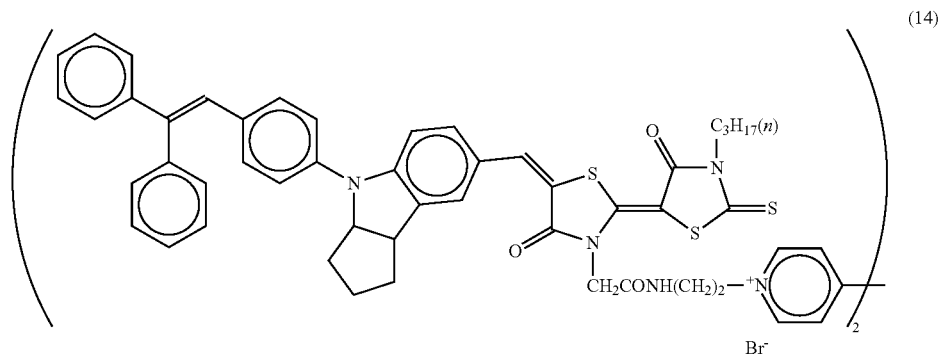

(14)

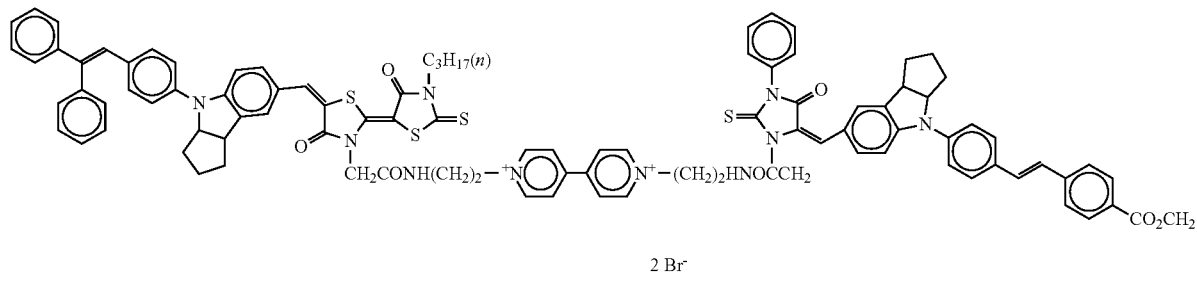

(15)

Example 3

A photoelectric conversion element of Example 3 was obtained as in Example 1 except that D1C10VC10D1' represented by chemical formula (16) below was used as the dye molecule:

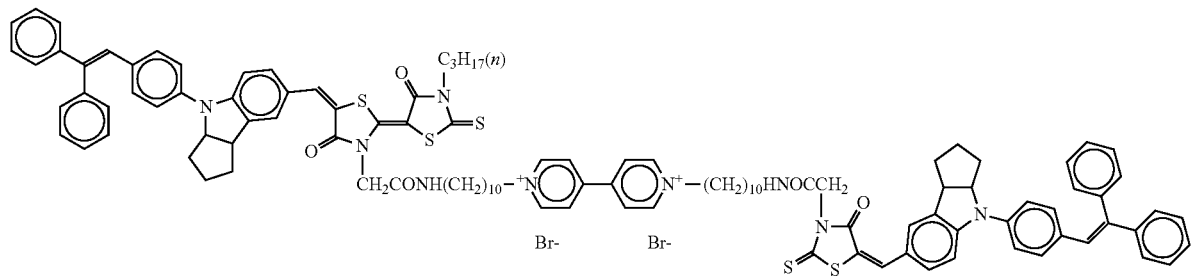

(16)

Example 4

A photoelectric conversion element of Example 4 was obtained as in Example 1 except that D1VD1'-D1VD1' represented by chemical formula (17) below was used as the dye molecule:

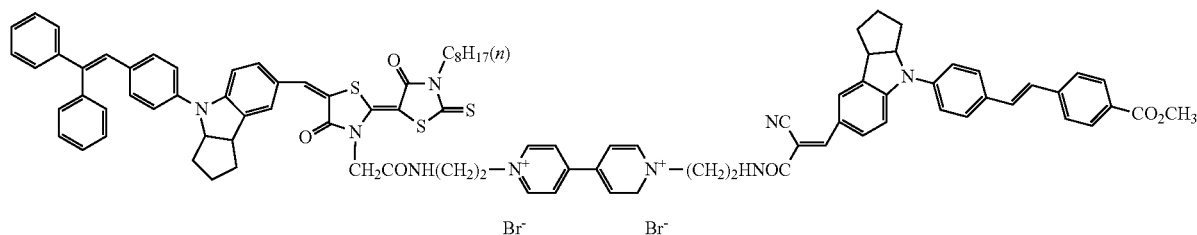

(17)

Comparative Example 1

A photoelectric conversion element of Comparative Example 1 was obtained as in Example 1 except that D1 represented by chemical formula (18) below was used as the dye molecule although the rest of the conditions were the same including the dye molecule concentration. The dye molecule of the photoelectric conversion element of Comparative Example 1 has a donor part (XD) but no acceptor part (YA).

(18)

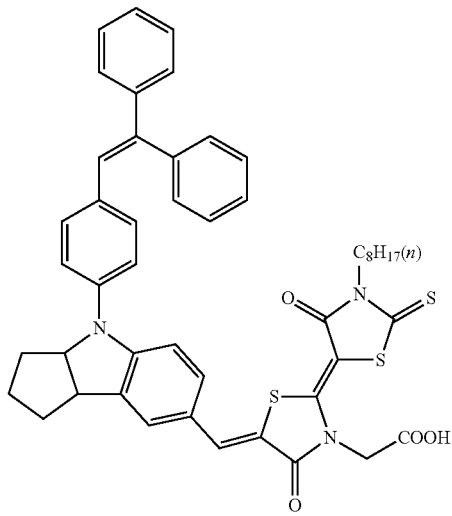

Comparative Example 2

A photoelectric conversion element of Comparative Example 2 was obtained as in Example 1 except that D1V represented by chemical formula (19) below was used as the dye molecule. The dye molecule of the photoelectric conversion element of Comparative Example 2 has one donor part (XD) and one acceptor part (YA).

presumably due to the aforementioned reasons described with reference to FIGS. 2A and 2B (Example), 3A and 3B (Comparative Example 1), and FIGS. 4A and 4B.

The conversion efficiency of the photoelectric conversion elements of Examples 1 and 2 is higher than the conversion efficiency of the photoelectric conversion elements of Examples 3 and 4.

The dye molecules (molecular weight: about 1200) used in Examples 1 and 2 have only two carbon atoms between the donor part (XD) and the acceptor part (YA). In contrast, the dye molecules (molecular weight: about 1300) used in Example 3 has an alkyl chain having 10 carbon atoms between the donor part (XD) and the acceptor part (YA). Accordingly, it is presumed that, in the dye molecule used in Example 3, migration of electrons from the donor part (XD) to the acceptor part (YA) is slightly inhibited. In other words, migration of electrons from the donor part (XD) to the acceptor part (YA) is faster and more efficient in the dye molecules used in Examples 1 and 2 than in the dye molecule used in Example 3. Thus, higher conversion efficiency is obtained in Examples 1 and 2.

The dye molecule (molecular weight: about 2400) used in Example 4 has a complicated structure in which two acceptor parts (YA) are present in one molecule and has a larger molecular weight than the dye molecules (molecular weight: about 1200) used in Examples 1 and 2. Thus, it is presumed that the acceptor parts (YA) of the dye molecule used in Example 4 failed to efficiently adsorb onto the surface of titanium oxide and migration from the acceptor parts (YA) to titanium oxide was not rapid. In other words, migration of electrons from the acceptor part (YA) to titanium oxide is faster and more efficient in the dye molecules used in (19)

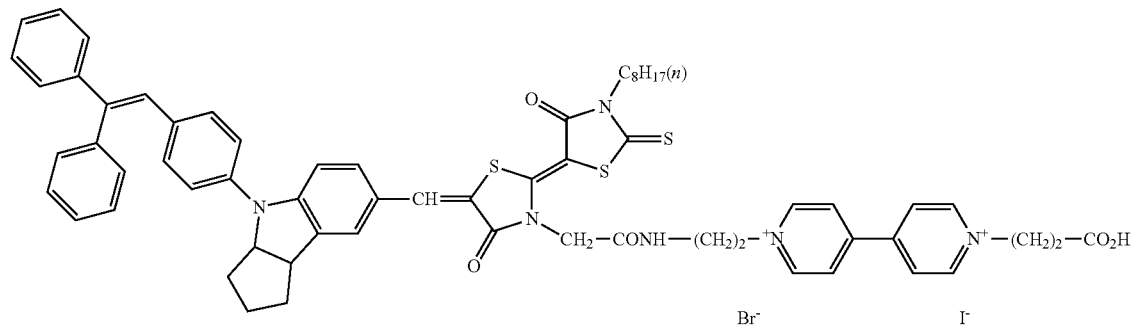

The conversion efficiency of the photoelectric conversion elements of Examples and Comparative Examples are indicated in Table 1. The conversion efficiency was determined from the I-V characteristic measured with a Keithley 2400 all-purpose source meter (produced by Keithley Instrumentals) in a 25° C. environment under 200 lx light per 1 $cm^2$ region of each photoelectric conversion element in plan view.

TABLE 1

| | Dye molecule | Conversion efficiency |
|---|---|---|
| Example 1 | D1VD1 | 20% |
| Example 2 | D1VD2 | 20% |
| Example 3 | D1C10VC10D1' | 18% |
| Example 4 | D1VD1'-D1VD1' | 17% |
| Comparative Example 1 | D1 | 10% |
| Comparative Example 2 | D1V | 12% |

As clear from the results in Table 1, the photoelectric conversion elements of Examples 1 to 4 have higher conversion efficiency than Comparative Examples 1 and 2. This is Examples 1 and 2 than in the dye molecule used in Example 4. Thus, higher conversion efficiency is obtained in Examples 1 and 2.

In sum, the dye molecule may have a structure in which the number of carbon atoms present between the donor part (XD) and the acceptor part (YA) is 2 or less and one acceptor part (YA) is present per molecule. The molecular weight of the dye molecule may be less than about 2000.

Table 2 indicates the transition strength of each dye molecule determined by a simulation based on a molecular orbital method using Samples Nos. 1 to 7 and conversion efficiency determined from photoelectric conversion elements prepared from the samples. Preparation of each photoelectric conversion element and measurement of the I-V characteristic are conducted as in Examples and Comparative Examples. The simulated transition strength is a figure that reflects not only the transition probability for absorption at the donor part but also the electron migration probability from the donor part to the acceptor part. Gaussian 09 produced by Gaussian Inc. was used in the simulation. Table 2 also indicates the basic structure of the dye molecule and XD/YA.

TABLE 2
| Sample No. | Basic structure of dye molecule | XD/YA | Simulated transition strength | Conversion efficiency at 200 lx |
|---|---|---|---|---|
| 1 | D | 1/0 | 20 | 10 |
| 2 | D-vio | 1/1 | 35 | 12 |
| 3 | . . . -D-vio-vio-D-vio-vio- . . . | 1/2 | 40 | 14 |
| 4 | . . . -D-vio-vio-vio-D-vio-vio-vio-D- . . . | 1/3 | 45 | 12 |
| 5 | D-vio-D | 2/1 | 70 | 19 |
| 6 | D-vio-D' | 2/1 | 105 | 20 |
| 7 | D<br>\|<br>D-vio-D | 3/1 | 210 | 18 |
The structures of the dye molecules used in Samples Nos. 1 to 7 are represented by chemical formulae (20) to (26) below:
Sample No. 1:
(20)
Sample No. 2:
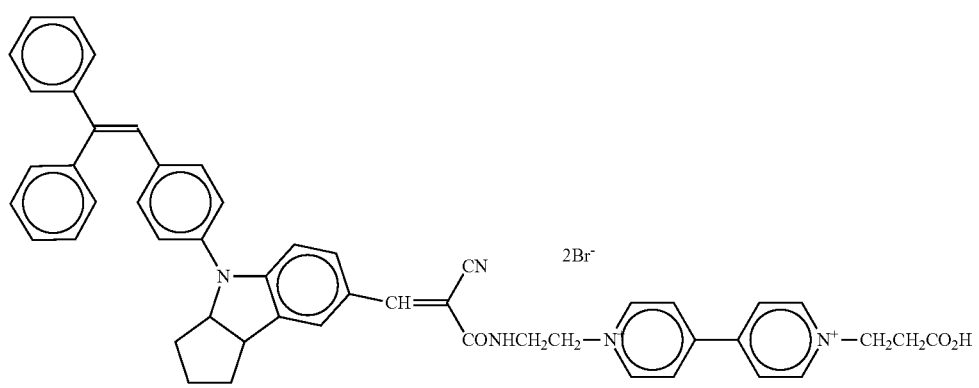
(21)

Sample No. 3:
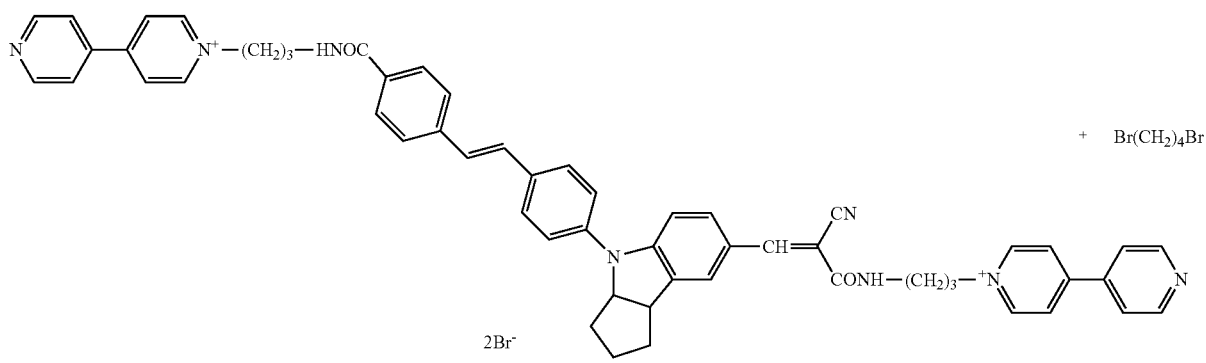
(22)
Sample No. 4:
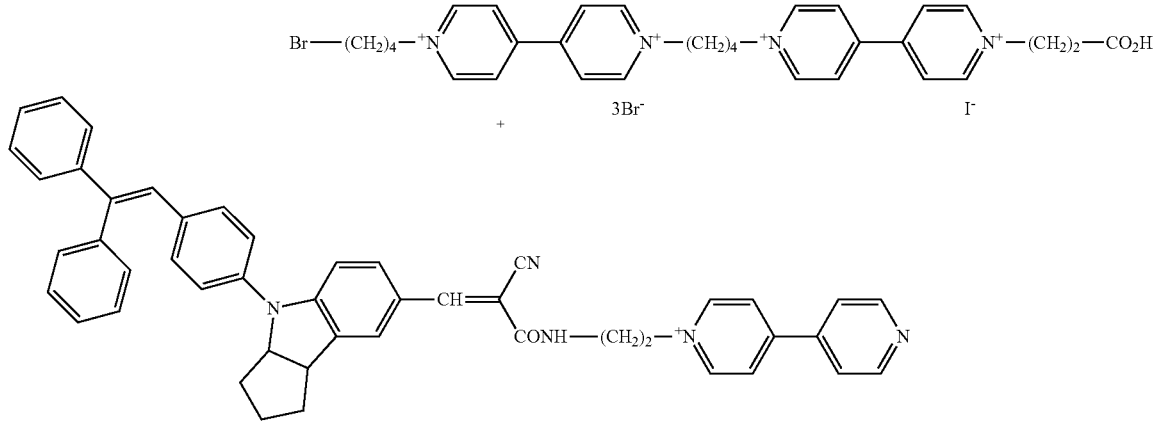
(23)
Sample No. 5:
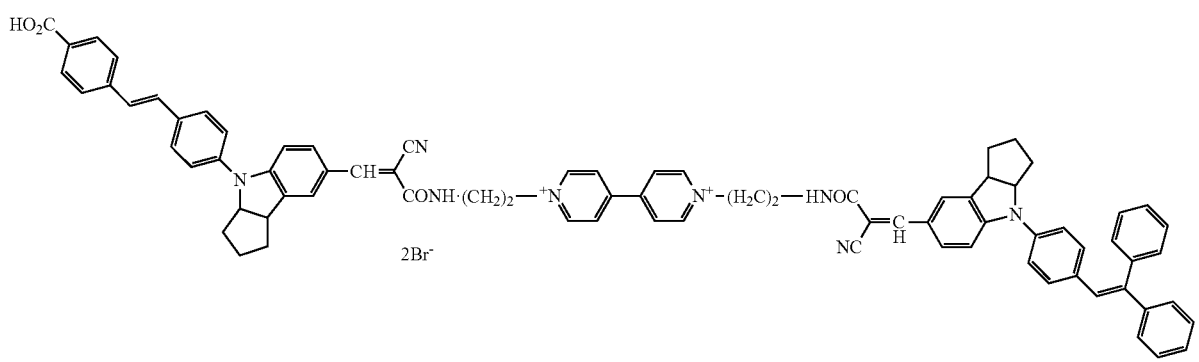
(24)
Sample No. 6:
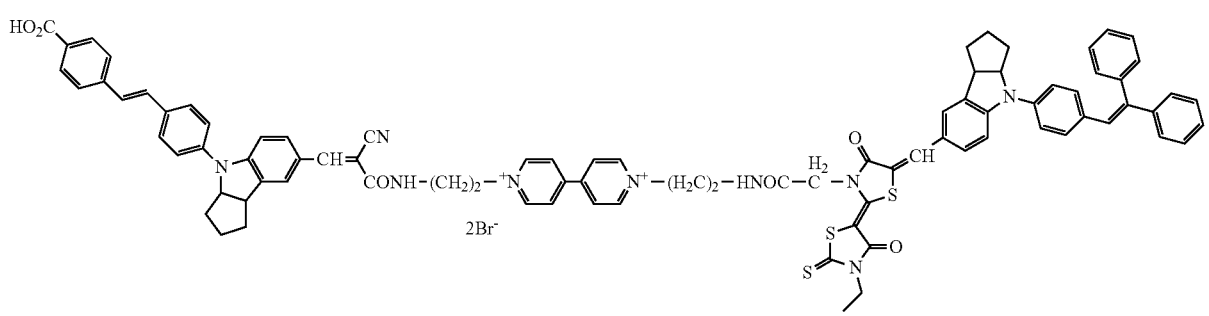
(25)

Sample No. 7:

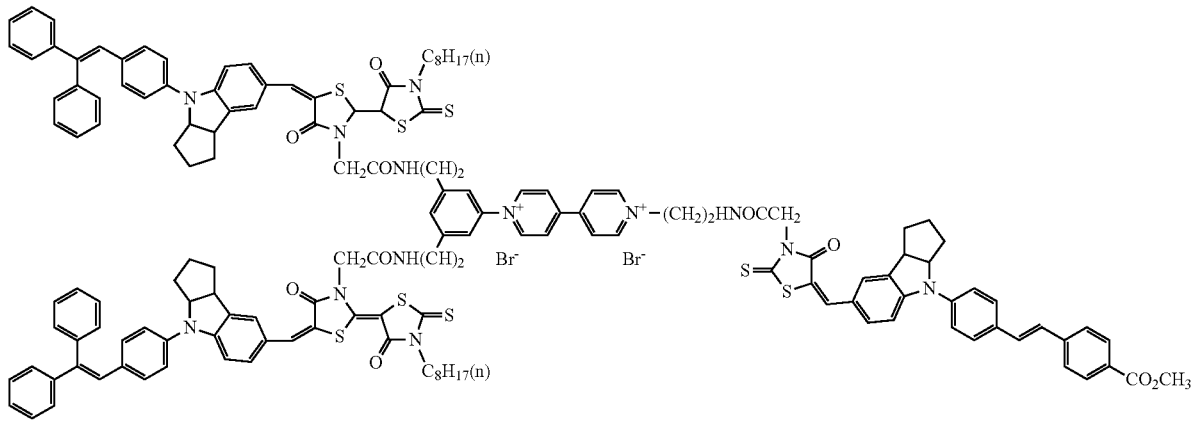

(26)

As clear from Table 2, the dye molecules of Sample Nos. 1 to 4 do not include YA and have an R(XD/YA) less than 2 and the simulated transition strength and the conversion efficiency of the photoelectric conversion elements are low. The dye molecules of Sample Nos. 5 and 6 have an R(XD/YA) of 2 or more and the simulated transition strength and the conversion efficiency of the photoelectric conversion element are high. The simulated transition strength of the dye molecule of Sample No. 7 in which XD/YA is 3/1 or 3 is higher than the simulated transition strength of the dye molecules of Sample Nos. 5 and 6 having R(XD/YA) of 2. However, the conversion efficiency of Sample No. 7 is similar to that of Sample Nos. 5 and 6. This is presumably because the electron migration probability from the donor part to the acceptor part limited the conversion efficiency in the dye molecule of Sample No. 7.

As apparent from the simulation results and experimental results indicated in Examples, Comparative Examples, and Table 2, a photoelectric conversion element that uses a dye molecule 16DA according to this disclosure exhibits high conversion efficiency even in an environment, such as an indoor environment, with a relatively low illuminance.

A photoelectric conversion element according to this disclosure can be used as a dye-sensitized power generating element that can generate power even in an environment, such as an indoor environment, with a relatively low illuminance.

The invention claimed is:

1. A dye-sensitized power generating element comprising:
   a photoanode that includes a solid semiconductor layer containing a dye molecule;
   a counter electrode; and
   an electrolyte medium disposed between the photoanode and the counter electrode,
   wherein the dye molecule includes XD represented by chemical formula (1) and YA represented by chemical formula (2):

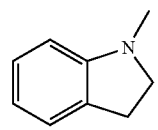

(1)

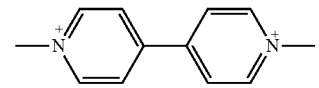

(2)

and R(XD/YA), which is a ratio of a number of XD to a number of YA in the dye molecule, is 2 or more.

2. The dye-sensitized power generating element according to claim 1, wherein R(XD/YA) is 4 or less.

3. The dye-sensitized power generating element according to claim 1, wherein the dye molecule includes two XD linked to each other with YA therebetween.

4. The dye-sensitized power generating element according to claim 1, wherein the dye molecule includes only one YA in the dye molecule.

5. The dye-sensitized power generating element according to claim 1, wherein two or less carbon atoms are present between YA and XD in the dye molecule.

6. The dye-sensitized power generating element according to claim 1, wherein the dye molecule is represented by general formula (I) below:

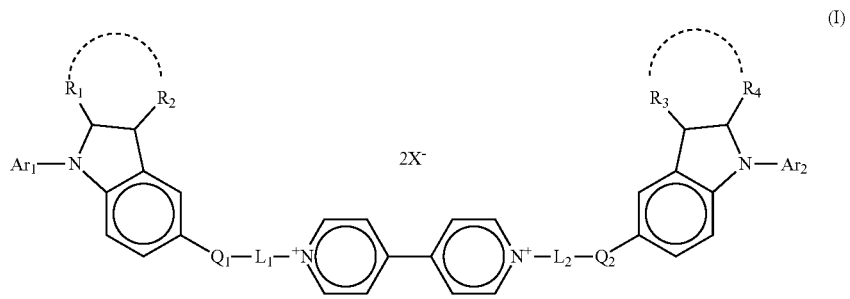

(I)

where $Ar_1$ and $Ar_2$ each independently represent an aromatic hydrocarbon residue; $R_1$ and $R_2$ each independently represent a hydrogen atom or an alkyl group or $R_1$ and $R_2$ are linked to each other so as to form a cyclopentane ring or cyclohexane ring; $R_3$ and $R_4$ each independently represent a hydrogen atom or an alkyl group or $R_3$ and $R_4$ are linked to each other so as to form a cyclopentane ring or cyclohexane ring; $Q_1$ and $Q_2$ each independently represent a divalent electron-withdrawing organic residue; $L_1$ and $L_2$ each independently represent an alkylene group; and $X^-$ represents a counter anion.

7. The dye-sensitized power generating element according to claim 6, wherein $Q_1$ and $Q_2$ each independently represent the divalent electron-withdrawing organic residue represented by one of general formulae (II), (III), (IV), (V), and (VI) below:

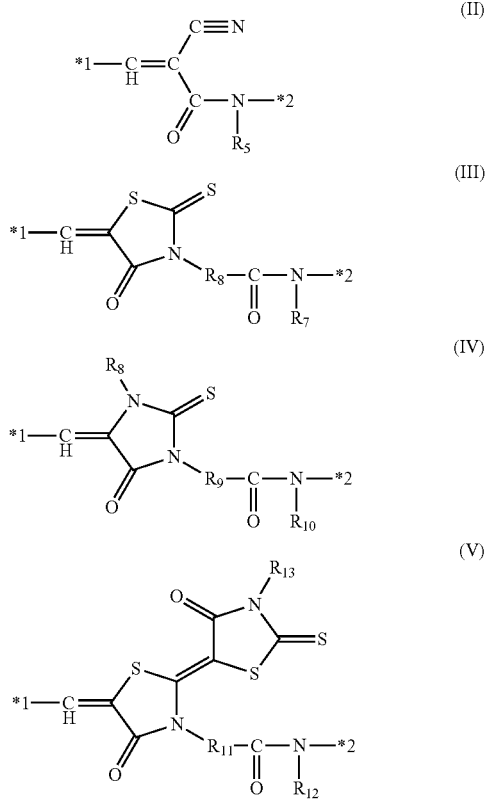

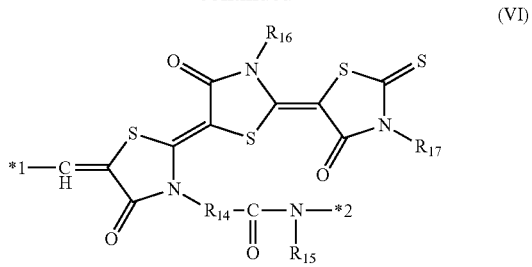

where $R_5$, $R_7$, $R_{10}$, $R_{12}$, and $R_{15}$ each independently represent a hydrogen atom or an alkyl group; $R_6$, $R_9$, $R_{11}$, and $R_{14}$ each independently represent an alkylene group; and $R_8$, $R_{13}$, $R_{16}$, and $R_{17}$ each independently represent an alkyl group, an aralkyl group, or an aryl group.

8. The dye-sensitized power generating element according to claim 7, wherein $R_5$, $R_7$, $R_{10}$, $R_{12}$, and $R_{15}$ each independently represent a hydrogen atom or an alkyl group having 1 or more and 4 or less carbon atoms; $R_6$, $R_9$, $R_{11}$, and $R_{14}$ each independently represent an alkylene group having 1 or more and 3 or less carbon atoms; and $R_8$, $R_{13}$, $R_{16}$, and $R_{17}$ each independently represent an alkyl group having 1 or more and 4 or less carbon atoms, an aralkyl group having 7 or more and 14 or less carbon atoms, or an aryl group having 6 or more and 14 or less carbon atoms.

9. The dye-sensitized power generating element according to claim 6, wherein $L_1$ and $L_2$ each independently represent an alkylene group having 2 or more and 10 or less carbon atoms.

10. The dye-sensitized power generating element according to claim 1, wherein the solid semiconductor layer is porous.

11. The dye-sensitized power generating element according to claim 10, wherein the dye molecule is located on a surface of the solid semiconductor layer.

12. The dye-sensitized power generating element according to claim 1, wherein the dye-sensitized power generating element is configured to generate electric power from incident light through photoelectric conversion.

* * * * *